United States Patent [19]

Lesk et al.

[11] Patent Number: 5,119,171
[45] Date of Patent: Jun. 2, 1992

[54] SEMICONDUCTOR DIE HAVING ROUNDED OR TAPERED EDGES AND CORNERS

[75] Inventors: Israel A. Lesk, Phoenix; Ronald E. Thomas, Tempe; George W. Hawkins, Mesa, all of Ariz.

[73] Assignee: Motorola, Inc., Schaumburg, Ill.

[21] Appl. No.: 674,291

[22] Filed: Mar. 22, 1991

Related U.S. Application Data

[63] Continuation of Ser. No. 159,800, Feb. 24, 1988, abandoned.

[51] Int. Cl.⁵ .............................................. H01L 23/48
[52] U.S. Cl. ...................................... 357/70; 357/72; 357/55
[58] Field of Search ...................... 357/74, 72, 55, 40, 357/68

[56] References Cited

U.S. PATENT DOCUMENTS 4,675,717 6/1987 Herrero ................................. 357/71

FOREIGN PATENT DOCUMENTS 60-254647 12/1985 Japan ..................................... 352/72

OTHER PUBLICATIONS

Egawa et al., "A 1-Mbit Full Wafer MOS RAM", IEEE Trans. Electron Dev. vol. ED-27, No. 8, pp. 1612-1621.

Primary Examiner—Andrew J. James
Assistant Examiner—Courtney A. Bowers
Attorney, Agent, or Firm—Harry A. Wolin

[57] ABSTRACT

An improved semiconductor die for plastic encapsulated semiconductor device packages which impedes the inherent delamination caused by the differing expansion coefficients of the semiconductor die and plastic encapsulation. Rounded or tapered die corners and die edges decrease the stress from the plastic encapsulation that acts upon the semiconductor die. This reduced stress slows the delamination progression and leaves the operational circuitry unaffected for an increased period of time thereby increasing device lifetime.

15 Claims, 2 Drawing Sheets

SEMICONDUCTOR DIE HAVING ROUNDED OR TAPERED EDGES AND CORNERS

This application is a continuation of prior application Ser. No. 07/159,800 filed Feb. 24, 1988 now abandoned.

BACKGROUND OF THE INVENTION

This invention relates, in general, to semiconductor devices, and more particularly to a semiconductor die having rounded or tapered edges and corners.

A semiconductor device in which this invention will typically be used includes a silicon semiconductor die having metal interconnect lines which are covered by passivation glass. The die is mounted on the flag of a leadframe and the die and flag are then encapsulated in plastic at a high temperature. The expansion coefficient of the plastic encapsulant is much larger than that of the silicon die and, therefore, the plastic encapsulant cannot fully contract during cooling. In large packages, deleterious results of this thermal expansion mismatch are especially evident during temperature cycling tests where the temperature extremes often range between −65 and 150 degrees centigrade.

When the plastic encapsulant contracts, large magnitudes of stress act on the silicon semiconductor die. The stress is highest on the edges and corners of the die. The stress causes the plastic encapsulation to crack adjacent to the corner of the semiconductor die which allows for relative motion between the plastic encapsulant and the semiconductor die. This motion causes the passivation glass of the semiconductor die to crack and break, further causing delamination. This delamination commonly travels through the metal interconnect lines and results in a semiconductor device having a decreased lifetime. Therefore, it would be advantageous to provide a semiconductor device having a higher resistance to stress failure caused by the difference of expansion between the plastic encapsulant and the silicon die.

SUMMARY OF THE INVENTION

Accordingly, it is an object of the present invention to provide a semiconductor die having rounded or tapered edges and corners that reduce the stress placed on the semiconductor die by a plastic encapsulation.

Another object of this invention is to provide a semiconductor die having rounded or tapered edges and corners which will substantially resist delamination.

It is an additional object of the present invention to provide a semiconductor die having rounded or tapered edges and corners wherein the edges and corners are rounded or tapered prior to wafer sawing.

A further object of the present invention is to provide a semiconductor die having rounded or tapered edges and corners that reduce the fracture and cracking of the die that is inherent in die sawing.

It is an additional object of the present invention to provide a semiconductor die having rounded or tapered edges and corners to allow for an increased semiconductor device lifetime and greater device reliability.

The foregoing and other objects and advantages are achieved in the present invention by rounding or tapering the edges and corners of a semiconductor die. These edges and corners are rounded or tapered using isotropic silicon etch steps which must be properly aligned. These steps are generally performed prior to wafer sawing or die separation. The rounded or tapered edges and corners reduce the stress which acts upon the semiconductor die thereby slowing the delamination between the passivation glass and the semiconductor die. This results in a longer device lifetime and greater reliability because the delamination does not reach the operational circuitry as quickly.

A more complete understanding of the present invention can be attained by considering the following detailed description in conjunction with the accompanying drawings.

DETAILED DESCRIPTION OF THE INVENTION

Figure 1:
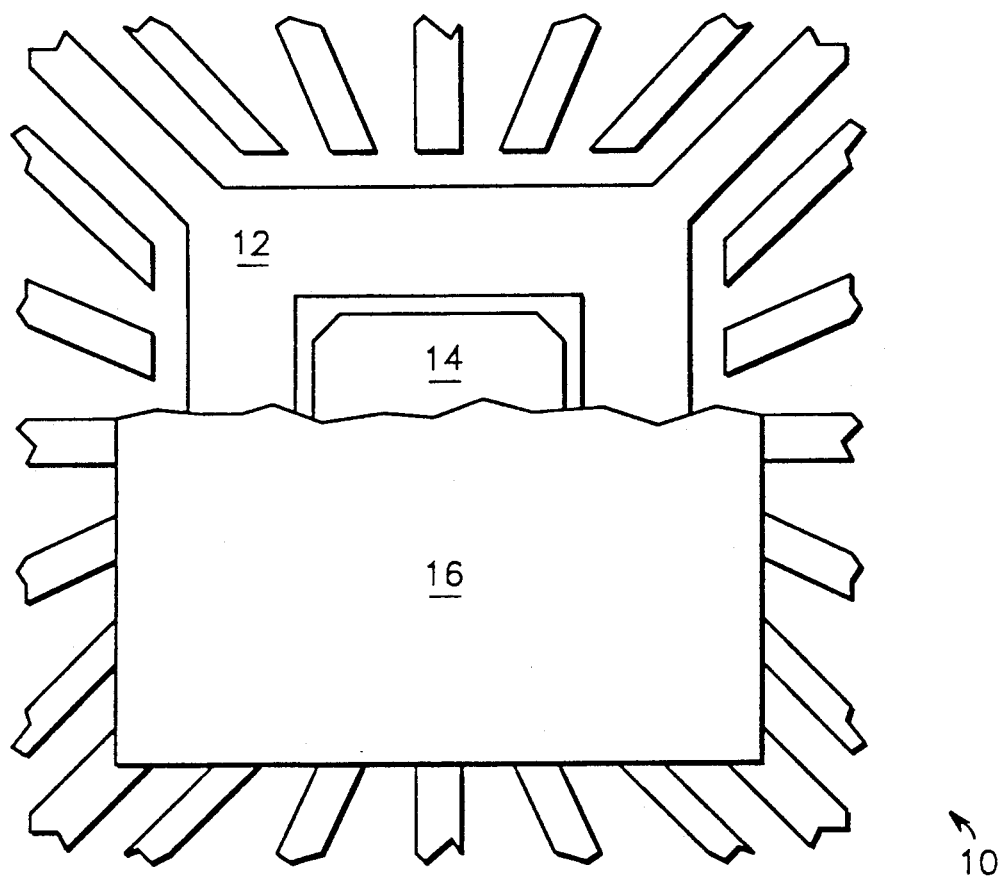
FIG. 1 is a highly enlarged top view of a plastic encapsulated semiconductor device having a portion of the plastic encapsulation cut away.

FIG. 1 is a highly enlarged top view of a plastic encapsulated semiconductor device of the type in which the present invention will be used. The device includes a leadframe 10 having a flag 12. A semiconductor die 14 is mounted on flag 12 of leadframe 10. A portion of leadframe 10 which includes flag 12 is encapsulated in a plastic encapsulation 16 which has been partially cut away in this figure.

Figure 2:
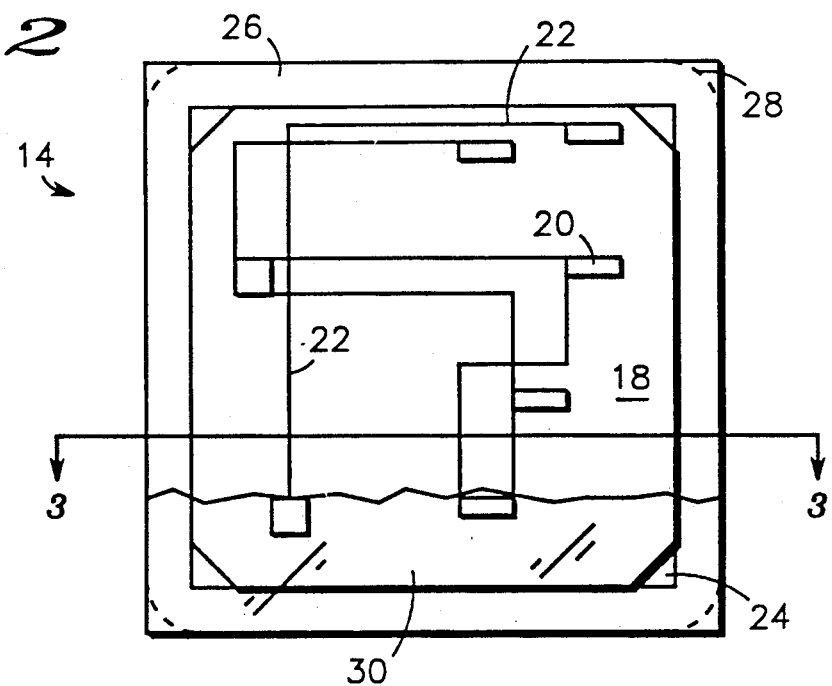
FIG. 2 is a highly enlarged top view of a semiconductor die which is included in the device of FIG. 1.

FIG. 2 illustrates a highly enlarged top view of semiconductor die 14. Semiconductor die 14 includes a circuit area 18 which contains all the operational circuitry of semiconductor die 14. The operational circuitry includes a plurality of bond pads 20 and interconnect lines 22. Both bond pads 20 and interconnect lines 22 are comprised of metal. One skilled in the art will recognize that many well known metals may be employed. Semiconductor die 14 further includes circuit area corners 24 which are void of operational circuitry. Circuit area corners 24 allow for a longer device lifetime by being void of operational circuitry because delamination there does not effect the operational circuitry of semiconductor die 14.

A scribe area 26 is included in semiconductor die 14 and borders circuit area 18. Scribe area 26 is void of circuitry and serves merely as an area where semiconductor die 14 is separated from other semiconductor dice after processing. In this embodiment, a plurality of rounded die corners, 28, are shown to be part of scribe area, 26. It should be understood that rounded die corners 28 may exist in areas other than scribe area 26. For example, rounded die corners 28 may pass through circuit area corners 24.

Semiconductor die 14 is further covered by passivation glass 30 which is shown partially removed. In this embodiment, passivation glass 30 is silicon dioxide which is doped with phosphorous. Passivation glass 30 keeps moisture and impurities away from circuit area 18 with the exception of bond pads 20 which remain uncovered. This reduces corrosion and increases device lifetime.

Figure 3:
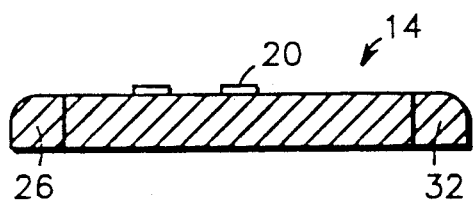
FIG. 3 is a cross-sectional view of the semiconductor die of FIG. 2 taken from line 3—3.

FIG. 3 is a cross-sectional view of semiconductor die 14 taken from line 3—3 of FIG. 2. Semiconductor die 14 includes rounded die edges 32. Rounded die edges 32 are shown to be in scribe area 26, however, it should be understood that rounded die edges 32 need not always remain within scribe area 26. Rounded die edges 32 and rounded die corners 28 of FIG. 2 reduce the stress from plastic encapsulation 16 of FIG. 1 which acts upon semiconductor die 14. By reducing this stress, the delamination of passivation glass 30 may be slowed leaving certain interconnect lines 22 which are disposed near the outer periphery of circuit area 18 unaffected for a longer period of time. This allows for better reliability and increased device lifetime.

The present invention also reduces fracture and cracking problems which are common during wafer sawing or die separation. By rounding or tapering die corners 28 and die edges 32 using isotropic etch steps before sawing, sawing imperfections will be reduced. It should be understood that these isotropic etch steps must be properly aligned and may be performed at various times throughout the process sequence although they are preferably performed after completion of the wafer process sequence.

Figure 4:
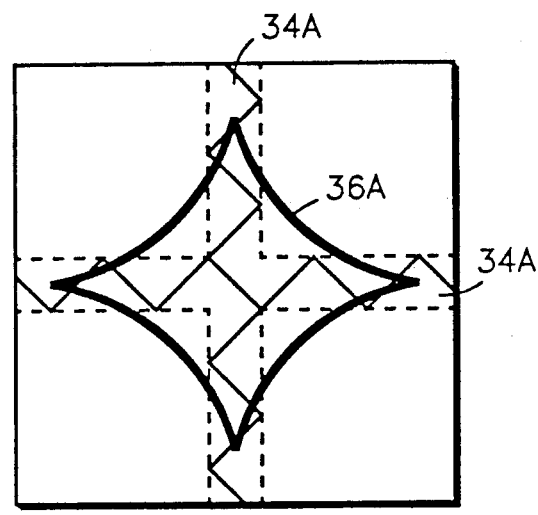
FIGS. 4-6 are highly enlarged top views of the intersection of four semiconductor dice prior to sawing.
Figure 5:
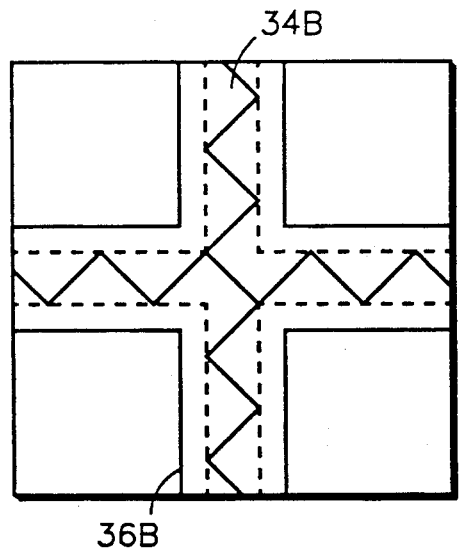
Figure 6:
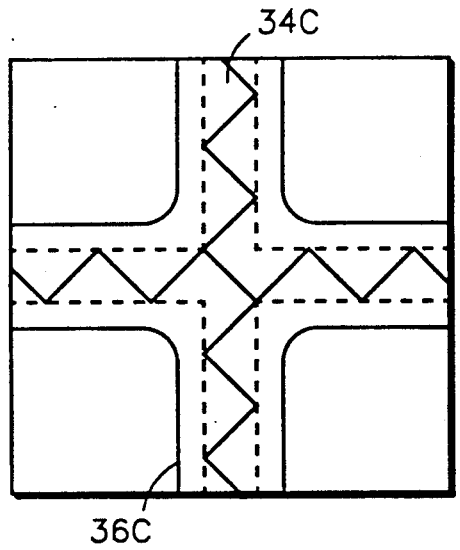

FIGS. 4-6 are highly enlarged top views of the intersections of four silicon dice prior to sawing or separation. FIG. 4 shows saw cut areas 34A which separate the four dice. An etch mask boundary 36A is shown on the intersection. Etch mask boundary 36A yields rounded die corners but not rounded die edges. FIG. 5 shows etch mask boundary 36B which yields rounded die edges and rounded die corners. FIG. 6 includes etch mask boundary 36C which yields more gradually rounded die corners and rounded die edges. The resultant semiconductor dice obtained by using etch mask boundaries 36B and 36C will be similar to semiconductor die 14 of FIGS. 2 and 3.

Thus it is apparent that there has been provided, in accordance with the invention, an improved semiconductor device and die which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of the invention.

We claim:

1. A semiconductor die for plastic encapsulation comprising:
   a first surface and a second surface and sides disposed therebetween on the periphery of said die;
   an operational circuitry area disposed in said first surface; and
   a plurality of die corners being void of circuitry wherein said first surface and portions of said sides adjacent thereto are rounded or tapered at said die corners to reduce stress to said die caused by a plastic encapsulation.

2. The die of claim 1 wherein a scribe area void of circuitry borders the operational circuitry area of said die.

3. The die of claim 2 wherein the scribe area includes the die corners.

4. The die of claim 1 further comprising a plurality of die edges being void of circuitry wherein said first surface and portions of said sides adjacent thereto are rounded or tapered at said die edges.

5. The die of claim 3 further comprising a plurality of die edges being void of circuitry wherein said die edges are included in the scribe area and said first surface and portions of said side adjacent thereto are rounded or tapered at said die edges.

6. A semiconductor die for plastic encapsulation comprising:
   a first surface and a second surface and sides disposed therebetween on the periphery of said die;
   an operational circuitry area disposed in said first surface; and
   a plurality of die edges being void of circuitry wherein said first surface and portions of said sides adjacent thereto are rounded or tapered at said the edges to reduce stress to said die caused by a plastic encapsulation.

7. The die of claim 6 wherein a scribe area void of circuitry borders the operational circuitry area of said die.

8. The die of claim 7 wherein the scribe area includes the die edges.

9. The die of claim 6 further comprising a plurality of die corners being void of circuitry wherein said first surface and portions of said sides adjacent thereto are rounded or tapered at said die corners.

10. The die of claim 8 further comprising a plurality of die corners being void of circuitry wherein said die corners are included in the scribe area and said first surface and portions of said sides adjacent thereto are rounded or tapered at said die corners.

11. A plastic encapsulated semiconductor device comprising:
    a lead frame including a flag;
    a semiconductor die disposed on said flag of said leadframe, said die having a first surface, a second surface, sides disposed therebetween on the periphery of said die and a plurality of die corners which are void of circuitry and wherein said first surface and portions of said sides adjacent thereto are rounded or tapered at said die corners to reduce stress to said die caused by a plastic encapsulation; and
    a plastic encapsulant encapsulating said flag of said leadframe including said die.

12. The device of claim 11 wherein a scribe area void of circuitry borders the die.

13. The device of claim 12 wherein the scribe area includes the die corners.

14. The device of claim 11 wherein the die further comprises a plurality of die edges being void of circuitry wherein said first surface and portions of said sides adjacent thereto are rounded or tapered at said die edges.

15. The device of claim 13 wherein the die further comprises a plurality of die edges being void of circuitry wherein said die edges are included in the scribe area and said first surface and portions of said sides adjacent thereto are rounded or tapered at said die edges.

* * * * *

UNITED STATES PATENT AND TRADEMARK OFFICE
CERTIFICATE OF CORRECTION

PATENT NO. : 5,119,171

DATED : June 2, 1992

INVENTOR(S) : Israel A. Lesk et al

It is certified that error appears in the above-identified patent and that said Letters Patent is hereby corrected as shown below:

Claim 6, column 4, line 16, change "the" to --die--.

Signed and Sealed this

Thirtieth Day of November, 1993

BRUCE LEHMAN

*Attest:*

*Attesting Officer*    *Commissioner of Patents and Trademarks*